United States Patent
Waltari

(10) Patent No.: US 9,030,340 B1
(45) Date of Patent: *May 12, 2015

(54) N-PATH INTERLEAVING ANALOG-TO-DIGITAL CONVERTER (ADC) WITH BACKGROUND CALIBRATION

(71) Applicant: IQ-Analog Corporation, San Diego, CA (US)

(72) Inventor: Mikko Waltari, Escondido, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/531,371

(22) Filed: Nov. 3, 2014

Related U.S. Application Data

(63) Continuation-in-part of application No. 14/511,206, filed on Oct. 10, 2014, now Pat. No. 8,917,125, which is a continuation-in-part of application No. 14/081,568, filed on Nov. 15, 2013, now Pat. No. 8,878,577, which is a continuation-in-part of application No. 13/603,495, filed on Sep. 5, 2012, now Pat. No. 8,654,000.

(51) Int. Cl.
  *H03M 1/06* (2006.01)
  *H03M 1/12* (2006.01)
(52) U.S. Cl.
  CPC .......... *H03M 1/0617* (2013.01); *H03M 1/1245* (2013.01)

(58) Field of Classification Search
  CPC ............ H03M 1/0617; H03M 1/1245; H03M 1/1215; H03M 1/121
  USPC .......................................... 341/118, 120, 155
  See application file for complete search history.

(56) References Cited

U.S. PATENT DOCUMENTS 6,392,575 B1 * 5/2002 Eklund .......................... 341/141
6,873,281 B1    3/2005 Esterberg et al.
(Continued)

FOREIGN PATENT DOCUMENTS

CN    102291141    3/2014

OTHER PUBLICATIONS

Mark Looney, "Advanced Digital Post-Processing Techniues Enhance Performance in Time-Interleaved ADC SYstems", Analog Devices library, vol. 37—Aug. 2003, 10 pages.

(Continued)

*Primary Examiner* — Khai M Nguyen
(74) *Attorney, Agent, or Firm* — Law Office of Gerald Maliszewski; Gerald Maliszewski

(57) ABSTRACT

A system and method are provided of performing background corrections for an interleaving analog-to-digital converter (ADC). An analog input signal $s1(t)$ is accepted having a first frequency f1 and a bandwidth (BW). A clock at frequency fs creates n sample clocks with evenly spaced phases, each having a sample clock frequency of fs/2. A first tone signal $s2(t)$ is generated at second frequency f2, outside BW. The analog input signal and the first tone signal are combined, creating a combination signal, which is sampled using the sample clocks, creating n digital sample signals per clock period 1/fs. The n digital sample signals are interleaved, creating an interleaved signal. Corrections are applied that minimize errors in the interleaved signal, to obtain a corrected digital output. Errors are determined at an alias frequency f3, associated with the second frequency f2, to obtain correction information for a rotating pair of digital sample signals.

22 Claims, 11 Drawing Sheets

(56) References Cited

U.S. PATENT DOCUMENTS

| | | |
|---|---|---|
| 7,250,885 B1 | 7/2007 | Nairn |
| 7,253,762 B2 | 8/2007 | Huang et al. |
| 7,301,486 B2 | 11/2007 | Wang et al. |
| 7,471,339 B2 * | 12/2008 | Smith et al. .................... 348/572 |
| 7,777,660 B2 * | 8/2010 | Chen et al. .................... 341/155 |
| 7,843,373 B2 | 11/2010 | Carreau |
| 7,932,845 B2 | 4/2011 | Sheng et al. |
| 8,144,040 B2 * | 3/2012 | Messier et al. ................ 341/118 |
| 8,542,142 B2 | 9/2013 | Stein et al. |
| 8,604,953 B2 | 12/2013 | Ali |
| 8,730,072 B2 | 5/2014 | Petigny et al. |
| 2008/0048897 A1 | 2/2008 | Parthasarthy et al. |
| 2012/0075129 A1 | 3/2012 | Kidambi |
| 2013/0106632 A1 | 5/2013 | Petigny et al. |
| 2014/0015703 A1 | 1/2014 | Pullela et al. |

OTHER PUBLICATIONS

Razavi et al., "Problem of Timing Mismatch in Interleaved ADCs", 978-1-4673-1556-2/12/$31.00@2012 IEEE, 8 pages.

Vogel et al., "Adaptive Blind COmpensation of Gain and Timing Mismatches in M-Channel Time-Interleaved ADCs", 978-1-4244-2182-4/08/$25.00, 2008 IEEE, 4 pages.

* cited by examiner

Fig. 4
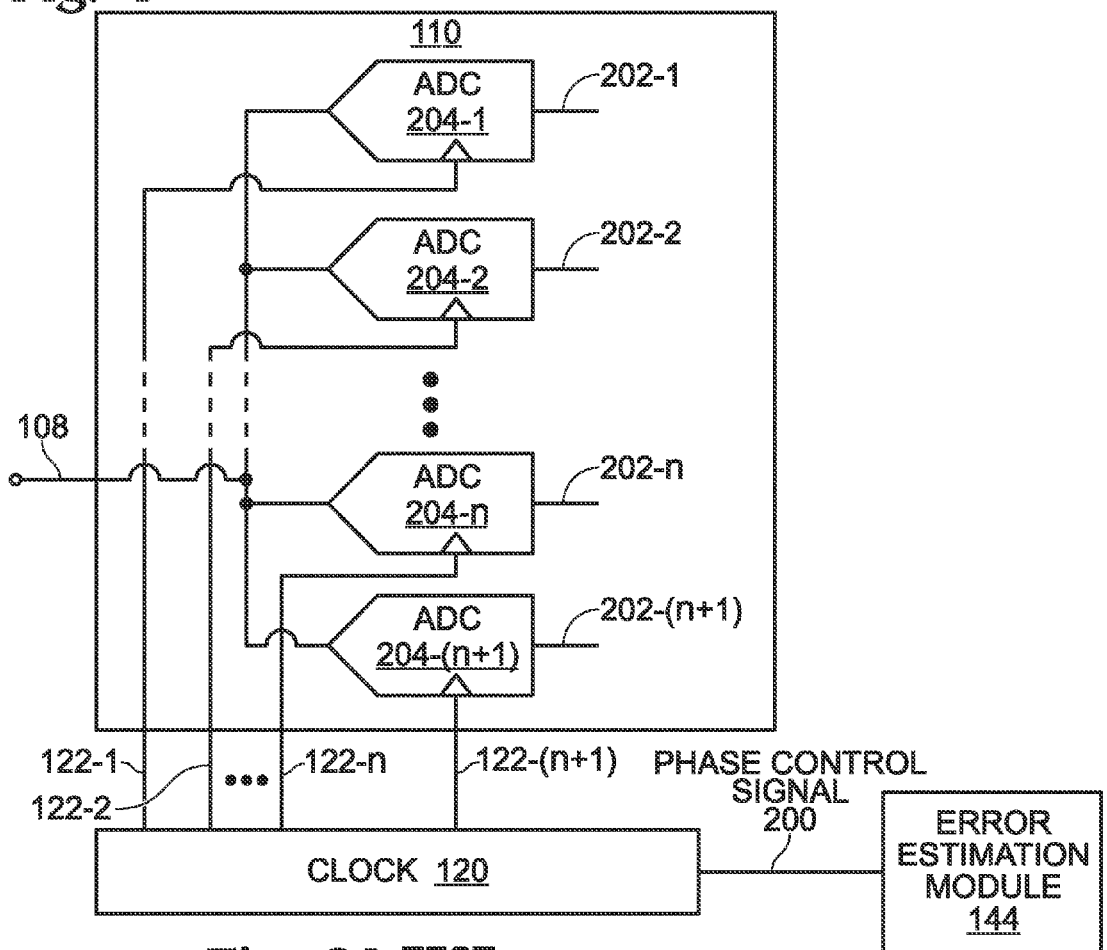
Fig. 6A TEST TONE
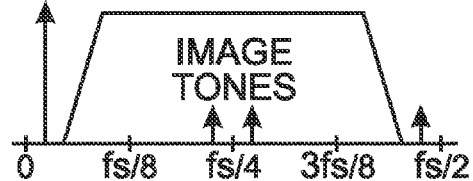
Fig. 6B TEST TONE
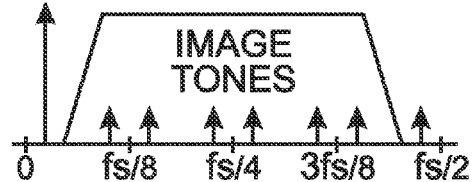

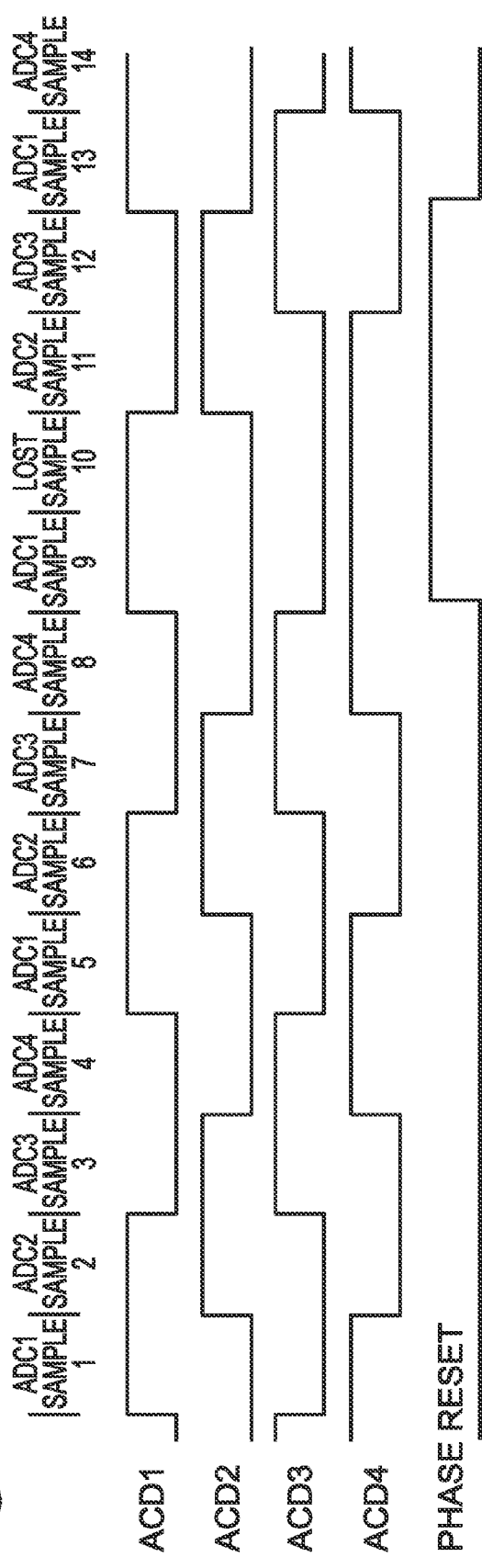

N-PATH INTERLEAVING ANALOG-TO-DIGITAL CONVERTER (ADC) WITH BACKGROUND CALIBRATION

RELATED APPLICATIONS

This application, is a Continuation-in-part of an application entitled, INTERLEAVING ANALOG-TO-DIGITAL CONVERTER (ADC) WITH BACKGROUND CALIBRATION, invented by Mikko Waltari et al., Ser. No. 14/511,206, filed Oct. 10, 2014, now U.S. Pat. No. 8,917,125, issued on Dec. 23, 2014;

which is a Continuation-in-part of an application entitled, SYSTEM AND METHOD FOR FREQUENCY MULTIPLIER JITTER CORRECTION, invented by Mikko Waltari et al., Ser. No. 14/081,568, filed Nov. 15, 2013, now U.S. Pat. No. 8,878,577, issued on Nov. 4, 2014;

which is a Continuation-in-Part of an application entitled, TIME-INTERLEAVED ANALOG-TO-DIGITAL CONVERTER FOR SIGNALS IN ANY NYQUIST ZONE, invented by Mikko Waltari, Ser. No. 13/603,495, filed Sep. 5, 2012, issued as U.S. Pat. No. 8,654,000 on Feb. 18, 2014. All these application are incorporated herein by reference.

BACKGROUND OF THE INVENTION

1. Field of the Invention

This invention, generally relates to analog-to-digital converters (ADCs) and, more particularly, to a system and method for correcting errors in an n-path interleaved ADC.

2. Description of the Related Art

An N-path time interleaved ADC consists of n component ADCs operated in parallel, which together sample the signal n times at the rate of the individual ADC components. In practice, the component ADCs are never truly identical, and the sampling clocks they receive can have small phase deviations from the ideal sampling phase. As a result, these timing and gain errors produce artifacts that in frequency domain show up as spectral images of the desired signal centered around every multiple of fs/N, where fs is the sampling rate of the composite ADC. If the errors are known they can be corrected with either digital post-processing after the ADC, or with an analog correction circuitry in the ADC, or with some combination of the two. However, without knowing the ADC input signal, error detection is difficult.

One way to facilitate the error correction task is to inject a narrow band known test signal into the ADC input, in the background, while the ADC is operating normally, as described in parent application Ser. No. 14/511,206, which is incorporated herein by reference. This method works well a two-path case where the test tone produces an image tone, which is also out-of-band and possible to detect with good accuracy, in an n-path time interleaved ADC, one test tone produces (n−1) image tones, which all need to be accurately estimated to extract all the information needed for error calibration. The problem is that only one of the tones is in a frequency region that is free of signal content. All the other image tones share the same frequencies as the ADC input signal (see FIGS. 6A and 6B) and are impractical to be detected with sufficient accuracy in the background while the ADC input signal is present.

It would be advantageous if error detection could be performed at a single out-of-band frequency location for all the mismatch parameters in an n-path time-interleaved ADC.

SUMMARY OF THE INVENTION

Disclosed herein are a system and method to identify the phase and amplitude of a test tone inserted in the input of a time-interleaved n-path analog-to-digital converter (ADC), for the purpose of gain mismatch and timing skew calibration.

Accordingly, a method is provided of performing background corrections for an n-path interleaving ADC. The method accepts an analog input signal s1(t) having a first frequency f1 and a bandwidth (BW). A clock is generated having a clock frequency fs, and n sample clocks are created with evenly spaced phases, each having a sample clock frequency of fs/n. Also generated is a first tone signal s2(t) having a predetermined second frequency f2 outside BW. The analog input signal is combined with the first tone signal, creating a combination signal, which is sampled using the n sample clocks, resulting in n digital sample signals per clock period 1/fs. The n digital sample signals are interleaved, creating an interleaved signal. Corrections are applied that minimize errors in the interleaved signal to obtain a corrected digital output. Finally, errors are determined at an alias frequency f3, associated with the second frequency f2, to obtain correction information for a pair of digital sample signals. A 180 degree sample clock phase difference is maintained between the paired digital sample signals.

More explicitly, errors may be determined at the alias frequency f3 by electing a first digital sample signal, from among the n digital sample signals, as a constant. Then, the selection of the digital sample signal that is paired with the first digital sample signal is rotated from among the remaining (n−1) digital sample signals. As a result, correction information for the remaining (n−1) digital sample signals is sequentially obtained. In a system that samples the combination signal via n paths using n corresponding sample clock phases, rotating the selection of the digital sample signal that is paired with the first digital sample signal may include supplying a constant sample clock phase to a first path associated with the first digital sample signal. Then, the sample clock phases supplied to the remaining (n−1) paths are rotated. As an alternative, the method periodically reelects a new first digital sample signal from among the n digital sample signals, different than a preceding first digital sample signal election.

As another alternative, the method provides the combination signal to (n+1) potential paths. Then, determining errors at the alias frequency f3 may include electing a first path from among the (n+1) paths, as a constant first digital sample signal. During a sample clock phase rotation reset, a previously selected path is disengaged, a previously disengaged path is selected, and the phase relationship between the selected (n−1) paths is rotated. In this manner, correction information is sequentially obtained for n digital sample signals without interruption, due to sample clock phase rotation resets. As a variation, a previously disengaged path is elected as the first path during the sample clock phase rotation reset. As above, a previously selected path is disengaged and the phase relationship between the (n−1) selected paths is rotated.

Additional details of the above described method and an associated system performing background corrections for an n-path interleaving ADC are provided below.

BRIEF DESCRIPTION OF THE DRAWINGS

FIG. 4 is a schematic block diagram depicting a third variation of the interleaving ADC background calibration system in greater detail.

FIGS. 6A and 6B respectively depict the spectra of a four-path and an eight-path interleaving ADC.

FIG. 7B is an associated timing diagram.

DETAILED DESCRIPTION

Figure 1:
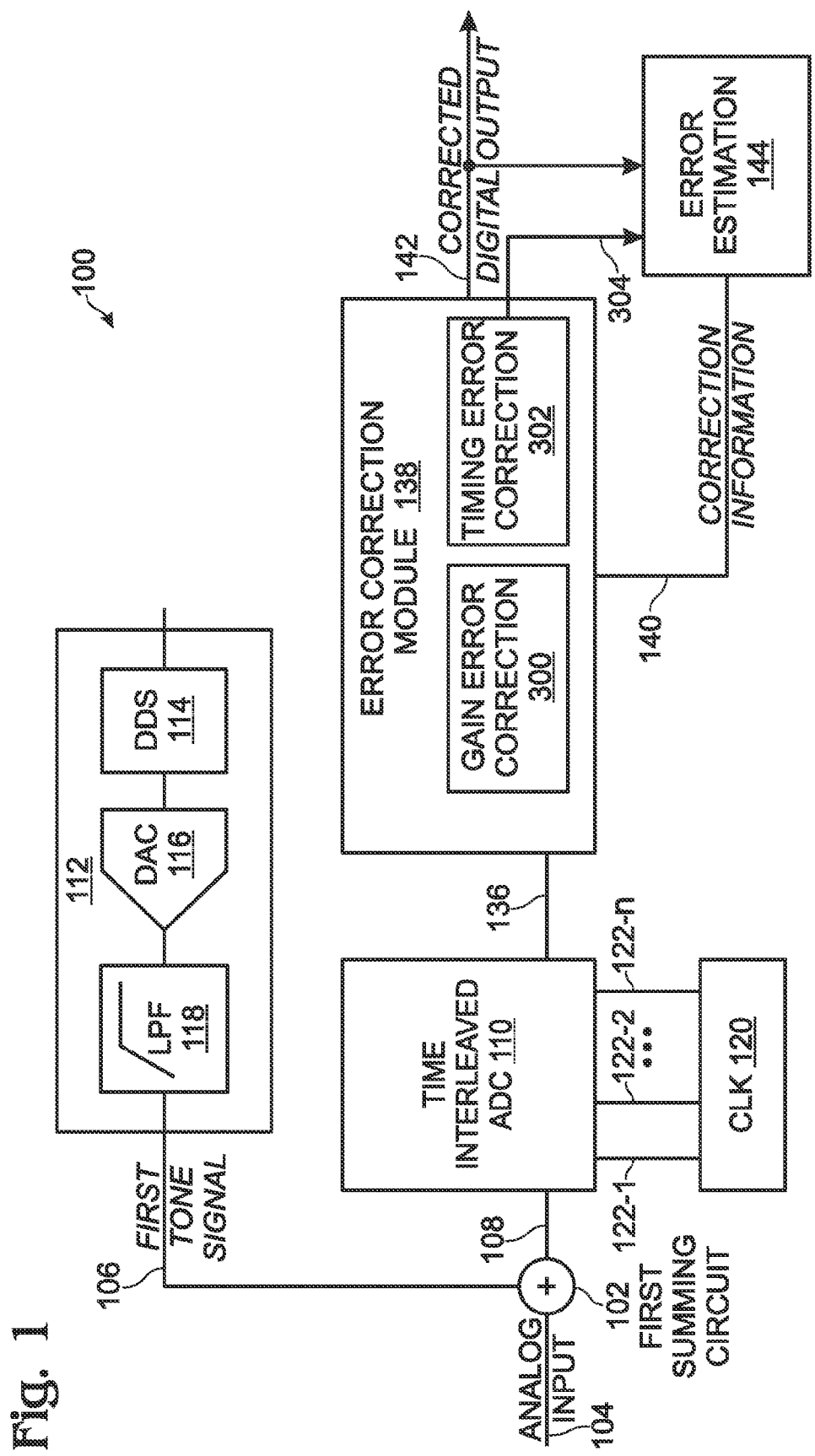
FIG. 1 is a schematic block diagram depicting a system performing background corrections for an n-path interleaving analog-to-digital converter (ADC).

FIG. 1 is a schematic block diagram depicting a system performing background corrections for an n-path interleaving analog-to-digital converter (ADC). The system 100 comprises a first summing circuit 102 having an input on line 104 to accept an analog input signal s1($t$) with a first frequency f1 and a bandwidth (BW). The summing circuit 102 has an input on line 106 to accept a first tone signal s2($t$) having a predetermined second frequency f2 outside BW. The first summing circuit 102 has an output on line 108 to supply a combination signal to time interleaved ADC 110. The first tone signal is supplied by signal or pilot tone generator 112. In one aspect, the signal generator 112 comprises a direct digital synthesizer (DDS) 114, digital-to-analog converter (DAC) 116, and low-pass filter 118. However, the system is not limited to any particular means of generating the first tone signal.

Clock 120 has a clock frequency fs, with outputs on lines 122-1 through 122-n to respectively supply n sample clocks with evenly spaced phases, each having a sample clock frequency of fs/n. Typically, n is a positive integer greater than one, and more typically an even integer. The interleaving ADC 110 has an input on line 108 to accept the combination signal and inputs on line 122-1 through 122-n to accept the n sample clocks. The interleaving ADC 110 creates n digital sample signals in response to sampling the combination signal with the n sample clocks, and supplies an interleaved signal at an output on line 136.

As used herein, the terms s1($t$) and s2($t$) represent signals in time domain. For example, a function of t may be sin (2·π·f1·t). In the term F{s(t)}, F is an operator for Fourier transform. S(f) is a signal in frequency domain. Using the explanations above, S(f)=F{s(t)}.

An error correction module 138 has an input on line 136 to accept the interleaved signal and an input on line 140 to accept correction information. The error correction module 138 applies corrections that minimize errors in the interleaved signal on line 136, and supplies a corrected digital output on line 142. The error correction module 138 supplies correction information for adjusting digital sample signal amplitudes, adjusting sample clock phases, adjusting the digital sample signal phases, or combinations or the above-mentioned adjustments.

Details of the error correction module are supplied in parent application Ser. No. 14/511,206, which application also supplies specific examples of implementing phase and gain adjustments. The corrections made in the case of a two-path interleaving ADC generally have equal validity in the case of an n-path interleaving ADC, as only two particular ADC paths are paired at any one time.

An error estimation module 144 has an input on line 142 to accept the corrected digital output. The error estimation module 144 determines errors at an alias frequency f3, associated with the second frequency f2, for a pair of digital sample signals, and supplies correction information at an output on line 140 for a first digital sample signal.

In one aspect, the error estimation module 144 performs a time-to-frequency conversion at the second frequency f2 and the third frequency f3, respectively creating S2($f$) and S3($f$) signals in the frequency domain. The error estimation module 144 compares the S2($f$) signal to the S3($f$) signal, and obtains a first in-phase component sign and magnitude and a second quadrature-phase component sign and magnitude. The error estimation module 144 supplies correction information to minimize the magnitude of the first component, the second component, or both the first and second components. Typically, the error estimation module 144 performs discrete Fourier transforms (DFTs) at frequencies f2 and f3.

In another aspect, the error estimation module 144 elects a first digital sample signal, from among the n digital sample signals, as a constant, and sequentially obtains correction information for the remaining (n−1) digital sample signals by rotating the selection of the digital sample signal paired with the first digital sample signal from among the remaining (n−1) digital sample signals. In one variation, the error estimation module 144 may apply equal and opposite corrections to the first digital sample signal and the paired digital sample signal. In another variation, the error estimation module 144 calculates the mean error of the (n) digital sample signals, and supplies correction information to minimize the mean error.

The clock 120 maintains a 180 degree phase difference between the sample clock supplied to the ADC first path and the sample clock supplied to the ADC path associated with the digital sample signal paired with the first digital sample signal.

As described in greater detail in parent application Ser. No. 14/511,206, the error correction module in some aspects may comprise a gain error correction module 300 and a timing error correction module 302, as shown. The timing error correction module 302 may supply an error estimation signal on 304 that may be input to the error estimation module. In other aspects described in the parent application, the error correction module may comprise just a gain correction module, as timing corrections are made in the clock with phase adjustments.

Figure 2:
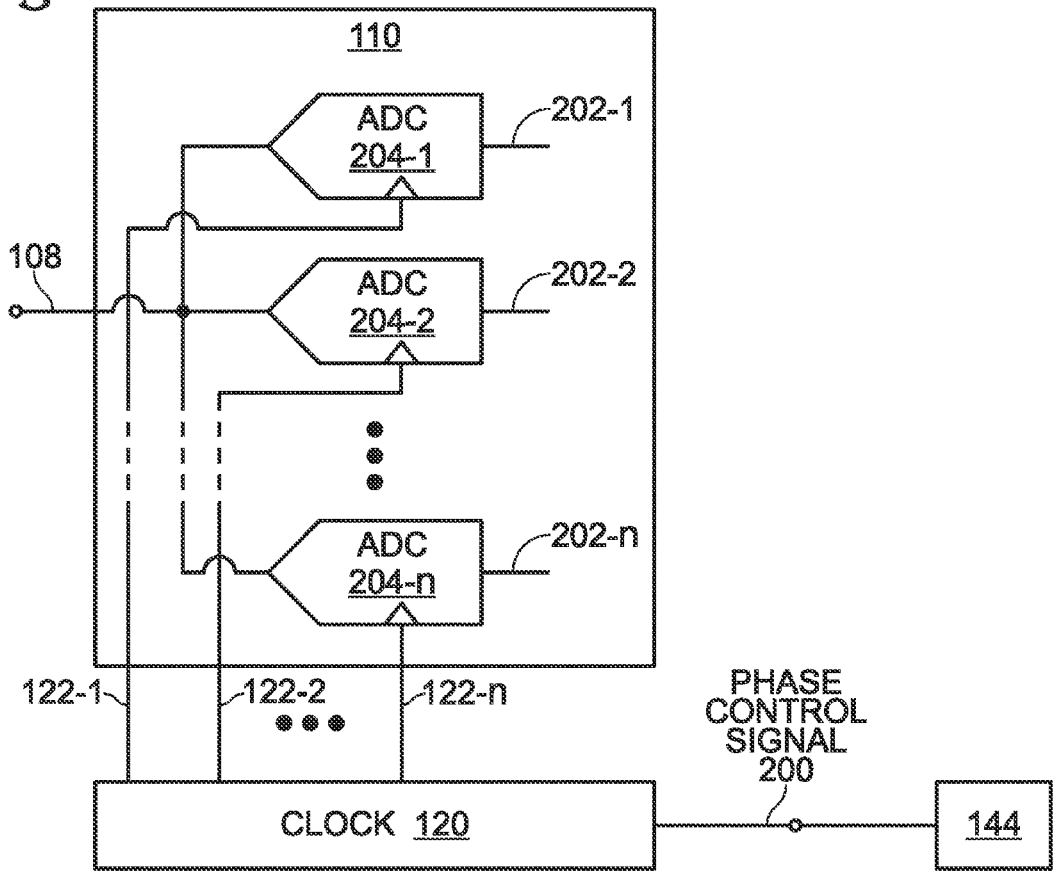
FIG. 2 is a schematic block diagram depicting one variation of the interleaving ADC background calibration system in greater detail.

FIG. 2 is a schematic block diagram depicting one variation of the interleaving ADC background calibration system in greater detail. In this aspect, the clock 120 has an input on line 200 to accept phase control signals for controlling the supply of the n sample clocks. The interleaving ADC 110 comprises n paths, 202-1 through 202-n. Each path includes a corresponding ADC 204-1 through 204-n having an analog input on line 108 to accept the combination signal and a clock input connected to a corresponding clock output 122-1 through 122-n. The error estimation module 144 has an output on line 200 to supply the phase control signal for electing a constant clock phase to be supplied to an ADC first path associated with the first digital sample signal (e.g., path 202-1 associated with ADC 204-1). The phase control signal rotates the sample clock phases supplied to the remaining ADC (n−1)

paths. In an example for n=4, in time interval 1, ADC 204-1 may receive the 0 degrees clock phase, ADC 204-2 the 90 degree phase, ADC 204-3 the 180 degree clock phase, and ADC 204-n the 270 degree clock phase. Thus, ADC 204-1 and ADC 204-3 are paired. Then in time interval 2, ADC 204-1 would again receive the 0 degrees clock phase, but ADC 204-2 might receive the 270 degree phase, ADC 204-3 the 90 degree clock phase, and ADC 204-n the 180 degree clock phase. Thus, ADC 204-1 and ADC 204-n are paired.

Figure 3:
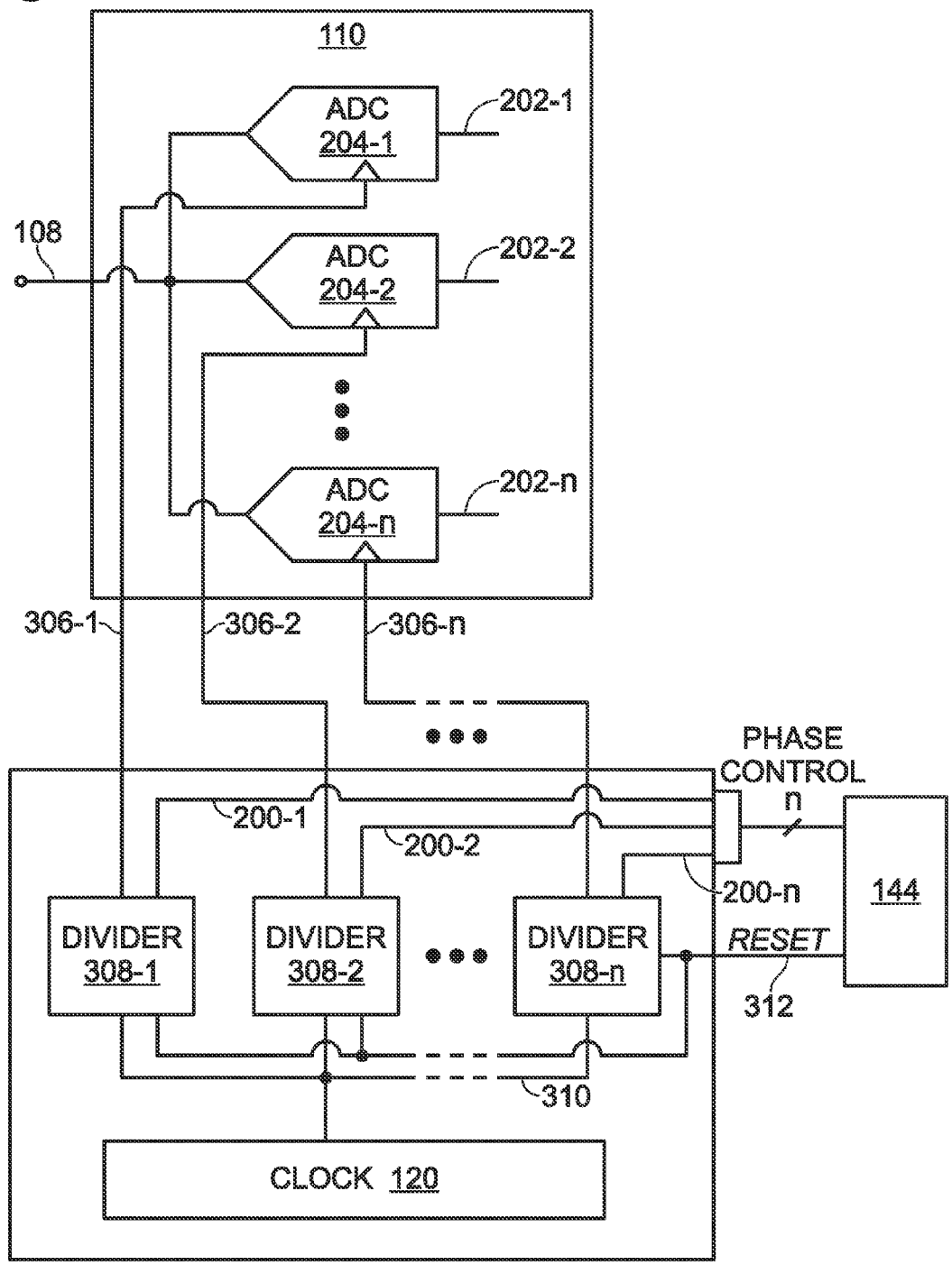
FIG. 3 is a schematic block diagram depicting a second variation of the interleaving ADC background calibration system in greater detail.

FIG. 3 is a schematic block diagram depicting a second variation of the interleaving ADC background calibration system in greater detail. As in FIG. 2, the interleaving ADC 110 comprises n paths, 202-1 through 202-n. Each path includes a corresponding ADC 204-1 through 204-n having an analog input on line 108 to accept the combination signal and a clock input connected to a corresponding clock output, in this case, 306-1 through 306-n.

The clock 120 comprises n dividers, 308-1 through 308-n. Each divider has an input on line 310 to accept a common master clock signal, an input to accept a corresponding phase control signal on lines 200-1 through 200-n, and an input on line 312 to accept a reset signal. The dividers 308-1 through 308-n have corresponding outputs on lines 306-1 through 306-n to supply a selectable starting clock phase to a corresponding ADC path 202-1 through 202-n in response to the phase control signal. The error estimation module 144 has outputs to supply the phase control signals on lines 200-1 through 200-n for rotating the selection of the starting clock phases supplied by the dividers 308-1 through 308-n, and an output on line 312 to supply the reset signals for initiating a sample clock phase rotation reset.

Note: although the dividers are shown to be embedded with the clock with fixed outputs to corresponding ADCs, the system could also be implemented by embedding a divider with each ADC. A counter is one example of a divider, but the system is not limited to any particular device in which the starting clock phase can be controlled.

In considering FIGS. 2 and 3, it is possible that data may be lost during sample clock phase rotation resets, for example, in the time between interval 1 and interval 2 in the above example. In this case, the error correction module 138 may interpolate current digital sample signals during the sample clock phase rotation reset. Other means for addressing this problem are presented below. As described above, the first path remains constant. However, it is also possible to reelect the first path based upon a rotation that is slower than the rotation by which the ADC paths are paired. That is, the error estimation module 144 may periodically reelect a new first digital sample signal from among the n digital sample signals, different than a preceding first digital sample signal election.

FIG. 4 is a schematic block diagram depicting a third variation of the interleaving ADC background calibration system in greater detail. The clock 120 has an input on line 200 to accept phase control signals, and an output on line 122-1 to supply a constant first clock phase to an ADC first path (e.g., 202-1) associated with the first digital sample signal. The clock 120 has n selectively engagable outputs on lines 122-2 through 122-(n+1) for controlling the supply of the (n−1) sample clocks.

In this aspect, the interleaving ADC 110 comprises (n+1) paths, 202-1 through 202-(n+1). Each path includes an ADC. ADCs 204-1 through 204-(n+1) each have an analog input on line 108 to accept the combination signal and a clock input connected to a corresponding clock output 122-1 through 122-(n+1). The error estimation module 144 has an output on line 200 to supply the phase control signals to the clock 120 for disengaging a previously selected ADC path (e.g., path 202-n), selecting a previously disengaged ADC path (e.g., 202-(n+1)), and rotating the phase relationship between the selected ADC paths. In this manner, correction information is obtained for n digital sample signals without interruption due to clock phase rotation resets.

In a variation to the above-described system, the clock 120 has (n+1) selectively engagable outputs, 122-1 through 122-(n+1) for controlling the supply of the n sample clocks. In this aspect, the error estimation module 144 supplies the phase control signals on line 200 to the clock 120 for disengaging a previously selected ADC path (e.g. path 202-n), electing a previously disengaged ADC path as a first path associated with the first digital sample signal (e.g., 202-(n+1)), and rotating the phase relationship between the selected ADC paths to obtain correction information for n digital sample signals without interruption due to clock phase rotation resets.

Note: although the error estimation module has been described as controlling the process of pairing digital sample signals, it should be understood that this function may be enabled in the error correction module, the clock, or the time interleaved ADC. It should also be understood that although the above-mentioned components are described as independent modules for convenience, they may in fact be a combination of modules or one module with an overlap in functions.

As described in the examples above, an n-path time interleaved ADC consists of n component ADC operated in parallel and together sampling the signal at n times that rate of the individual ADCs. In practice, the component ADCs are never truly identical and the sampling clocks they receive can have small phase deviations from the ideal sampling phase. As a result, these timing and gain errors produce artifacts which in frequency domain show up as spectral images of the desired signal centered around every multiple of fs/n, where fs is the sampling rate of the composite ADC. If the errors are known they can be corrected with either digital post-processing after the ADC, or with an analog correction circuitry in the ADC, or with some combination of the two.

Figure 5A:
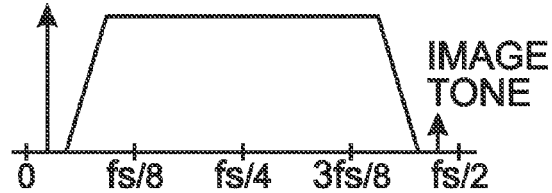
FIGS. 5A and 5B depict the spectrum of a two-channel time interleaved ADC with out-of-band test tones.
Figure 5B:
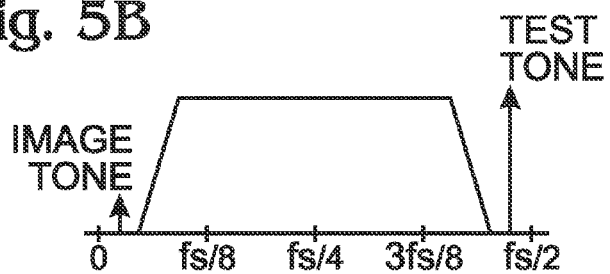

FIGS. 5A and 5B depict the spectrum of a two-channel time interleaved ADCs with out-of-band test tones. Without knowing the ADC input signal, error detection is difficult. One way to facilitate the task is to inject a narrow band known test signal into the ADC input outside the input signal band. In many applications the signal band is centered around fs/4 and leaves some unused bandwidth around DC and fs/2. In a two-path case if the test signal is, for instance, a tone with frequency ft and located close to DC, the path mismatch produces an image tone at frequency (fs/2−ft), see FIG. 5A. This tone is in the upper out-of-hand region and it is possible to detect with sufficient accuracy. In FIG. 5B, the test tone is located close to fs/2 and the image tone is near DC.

FIGS. 6A and 6B respectively depict the spectra of a four-path and an eight-path interleaving ADC. In FIG. 6A, the same test tone as used in FIG. 5A produces three image tones at frequencies fs/4−ft, fs/4+ft, and fs/2−ft. Two of the tones are in the middle of the input signal band and accurate detection is not practical. The third tone is still in the out-of-band region and can be detected. FIG. 6B depicts an eight-channel interleaving ADC. The situation for a larger number of channels is similar to FIG. 6A: only one of the tones is guaranteed to be in the out-of-band region.

To perform timing error and gain error correction for an n-path ADC, 2*(N−1) parameters are needed. Generally, this means that the same number of independent observations have to be carried out. The detection of one tone yields two independent measurements: the amplitude and the phase.

However, all tones have to be detected, and the simultaneous detection of all the tones is not practical for the reasons stated above.

As explained in the examples above, all the required 2*(N–1) parameters can be obtained by measuring the tone at the fs/2–ft location only. This is achieved by rearranging the component ADCs in (n–1) different ways and repeating the measurement for every configuration. The result is that 2*(n–1) independent observation results are required.

By "rearranging" the component ADCs it is meant that, for instance, in a four channel case the component ADCs can be labeled 1, 2, 3, and 4. In the nominal configuration, samples are taken in the order 1, 2, 3, 4, 1, 2, 3, 4, . . . . This is called configuration 1. In configuration 2, the samples are taken in order 1, 3, 4, 2 and in configuration 3 the order is 1, 4, 2, 3. Other possible configurations are: 1, 2, 4, 3; 1, 3, 2, 4; and 1, 4, 3, 2.

Figure 7A:
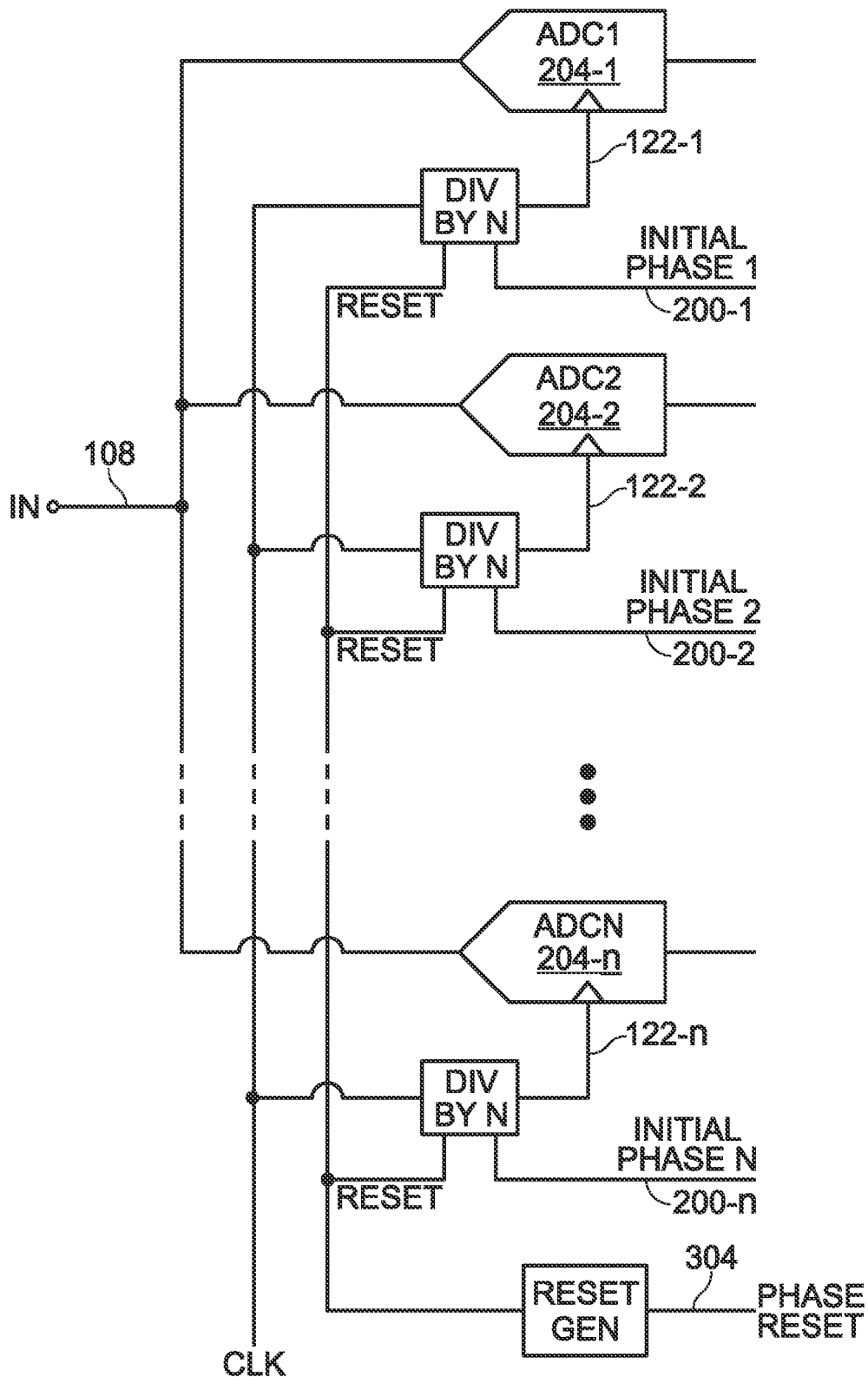
FIG. 7A is a schematic diagram depicting a system for measuring ADC timing errors.

FIG. 7A is a schematic diagram depicting a system for measuring ADC timing errors, and FIG. 7B is an associated timing diagram. The channel rearranging should be implemented in a way that doesn't change the mismatch parameters. One way that doesn't satisfy this condition is to generate all the clock phases centrally, and to have a multiplexer (MUX) in the ADC clock input to select the desired phase. The problem is that any delay mismatch in the clock signals prior the MUX is always associated with the same sampling phase, regardless the configuration. A method that does work is to send the full speed sampling clock (frequency fs) to each component ADC. Inside the ADC the clock is divided down with a divide-by-n circuit, which in every component ADC is initialized to start at a specific (different) phase. Now, the sampling phase depends only on the initial state of this divider, while all the circuit elements and clock paths are unchanged. Whatever timing mismatches exist always stay associated with the same component ADC. The system of FIG. 3 depicts an equivalent system with the divide-by-n circuits embedded with the clock.

During calibration the rearranging is performed periodically by resetting all the clock dividers to the new phases, as shown in FIG. 7B. This clock reset may lead to the loss of at least one signal sample. If needed, the lost sample can be substituted in the digital domain with an interpolated value with only a minimal impact on the signal-to-noise ratio (SNR).

Returning briefly to FIG. 4, one way to avoid the lost sample during the sample clock reset is to add one extra component ADC. Now there is always one idle channel immediately available for use. When the configuration is changed, the idle channel can be made the first ADC in the new sequence, and the last ADC of the previous sequence takes its turn as the idle ADC. The addition of one component ADC makes the total number of mismatch parameters 2n, otherwise the error detection scheme remains the same.

The error detection and correction structure can be similar to the one used in the two-channel case. At any given time the correction loop adjusts the parameters of two component ADCs in opposite directions, while keeping the parameters associated with the other channels unchanged. The ADCs to be adjusted are the first ADC with the constant 0° phase and the ADC with the 180° phase. While calibration is running, the channel configuration is periodically changed and at the same time the parameters to be adjusted are also changed so that they correspond to the ADCs that are currently associated with the sampling phases mentioned above.

Figures 8, 8A:
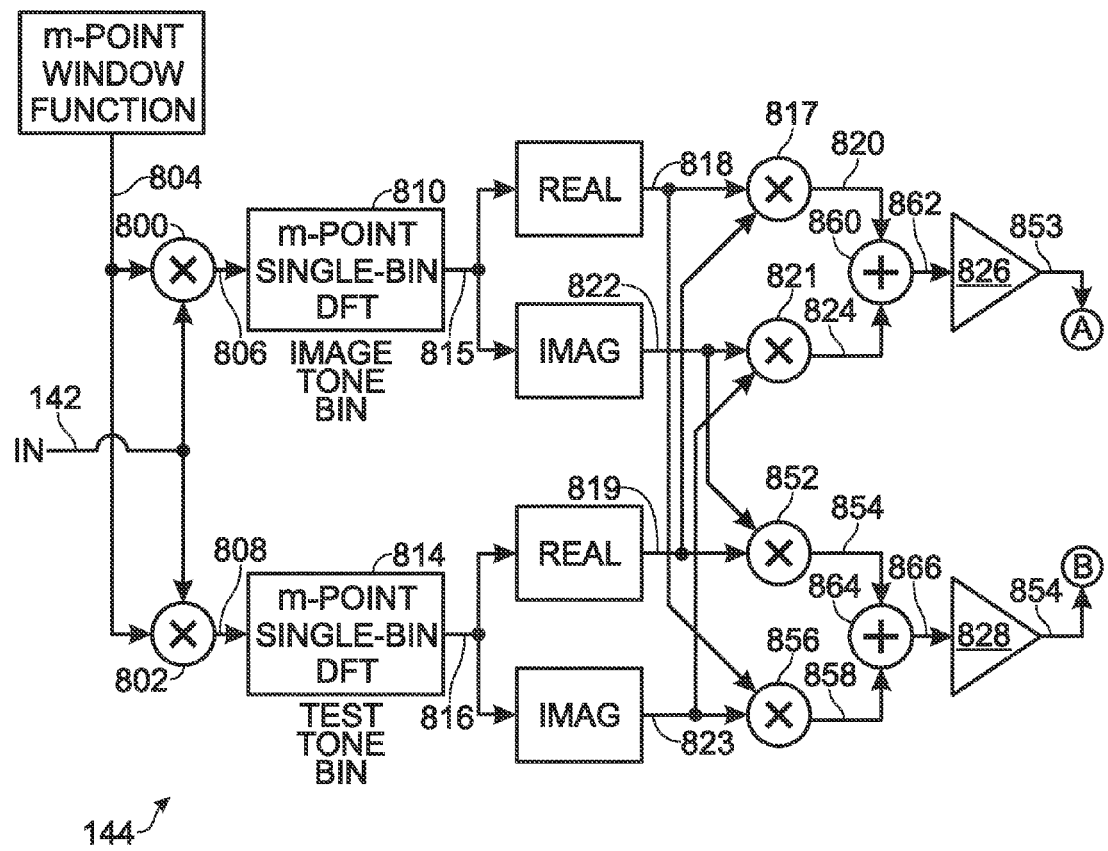
FIGS. 8, 8A, and 8B are schematic block diagrams depicting an exemplary error estimation module.
Figure 8B:
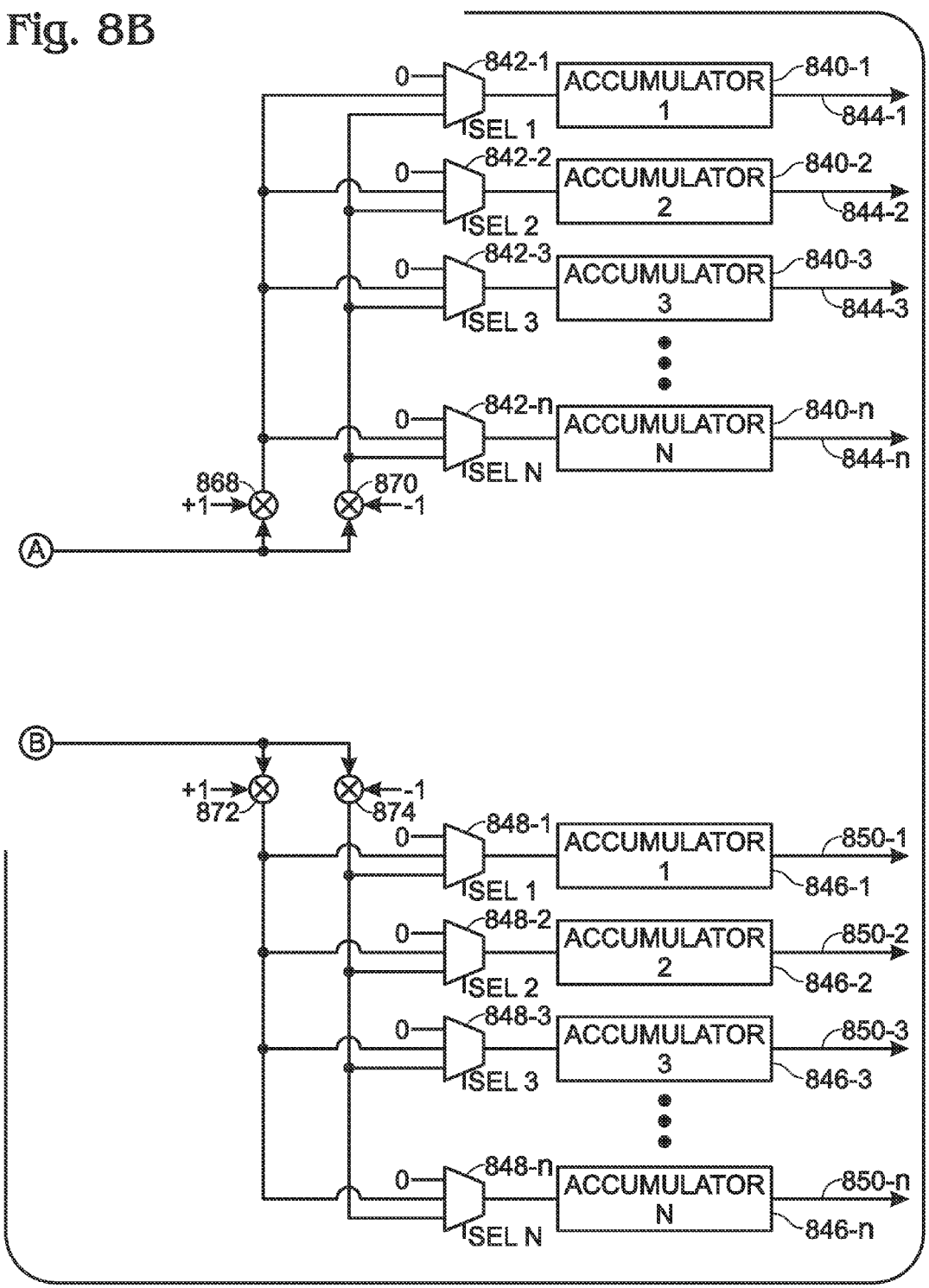

FIGS. 8, 8A, and 8B are schematic block diagrams depicting an exemplary error estimation module. Generally, error estimation can be implemented as described in FIGS. 8A, 8B, 9, and 10 of parent application. Ser. No. 14/511,206, as modified to accumulate gain and timing coefficients for n or (n+1) ADC paths, instead of for just two ADC paths. In the example depicted here, first multiplier 800 and a second multiplier 802 each have an input to accept the corrected digital output on line 142. In one variation derived from FIG. 3 of parent application Ser. No. 14/511,206, the input may be an error estimation signal, also shown in FIGS. 1 and 9 of the instant application. Multipliers 800 and 802 also accept an m-point window function on line 804, and have outputs, respectively on line 806 and 808, to supply a first windowed signal and a second windowed signal. Here it should be noted that the interleaving ADC (not shown in this figure) supplies an interleaved signal with a sequence of in samples per period (1/fs).

The error estimation module 144 further comprises a first time-to-frequency module that may be an m-point fast Fourier transform (FFT) module (not shown) or a discrete Fourier transform (DFT) module 810 centered on f3, to supply a first complex value on line 815. A second time-to-frequency module 814, which may be an m-point FFT module or a DFT module centered on f2 (as shown), supplies a second complex value on line 816. If modules 810 and 814 are DFT modules, they may perform either a single bin DFT algorithm or FFT function. As is well understood in the art, FFT is the most widely used DFT algorithm but it is not the only one. Its advantage is that when DFT is calculated for multiple frequency bins (m) its complexity grows in proportion to log(m). If only one or handful of frequency bins is needed, as in the systems described herein, FFT is not the most efficient algorithm. For example, the Goertzel algorithm provides a single frequency bin in a manner that is significantly more efficient than FFT.

A third multiplier 817 has inputs on lines 818 and 819 to respectively accept the real parts of the first and second complex values, and an output on line 820 to supply a first product. A fourth multiplier 821 has inputs on lines 822 and 823 to respectively accept the imaginary parts of the first and second complex values, and an output on line 824 to supply a second product. A fifth multiplier 852 has an input on line 819 to accept the real part of the second complex value, an input on line 822 to accept the imaginary part of the first complex value, and an output on line 854 to supply a third product. A sixth multiplier 856 has an input on line 818 to accept the real part of the first complex value, an input on line 823 to accept the imaginary part of the second complex value, and an output on line 858 to supply a fourth product.

A second summing circuit 860 has inputs on lines 820 and 824 to accept the first and second products, and an output on line 862 to supply a first sum. A first subtracting circuit 864 has inputs on lines 854 and 858 for subtracting the fourth product from the third product, and an output on line 866 to supply a first difference. Optionally as shown, the first sum and first difference may be respectively scaled using devices 826 and 828. The gain of the negative feedback loop (i.e. the error estimation module 144) needs to be set somewhere in the system. Here, the gain is set with devices 826 and 828. Alternatively, the gain factor can be built into the subsequent accumulators.

As described earlier in the text, when the channels are rotated, the parameters to be adjusted are changed. This is accomplished with the combination of the multiplexers 842-1 through 842-n and 848-1 through 848-n and the sign multipliers 868, 870, 872, and 874. When a particular ADC is not part of the pair under calibration, the selection signal selects the multiplexer input connected to zero. One of the ADCs of the current pair under calibration (e.g., 0 degree phase) has its multiplexer selection signal set to pick the path with the positive sign multipliers 868 and 872, and the other ADC (e.g., 180 degree phase) with the negative sign multipliers 870 and 874. This is how the parameters get adjusted in the opposite direction. Alternatively but not shown, the negative direction path can be eliminated, so that the first constant ADC (0 degree phase) is not adjusted and only the second ADC of the current pair (e.g., 180 degree phase) is adjusted with a positive sign multiplier. Sign multipliers 868 and 872 with the +1 input are of course redundant, and are just shown for reference.

Accumulators 840-1 through 840-n sequentially accept the adjusted gain parameters, as controlled by multiplexers 842-1 through 842-n, and output gain correction coefficients on lines 844-1 through 844-n as a form of gain correction information. Likewise, accumulators 846-1 through 846-n sequentially accept the adjusted phase parameters, as controlled by multiplexers 848-1 through 848-n, and output timing correction coefficients on lines 850-1 through 850-n as a form of timing correction information.

Figure 9:
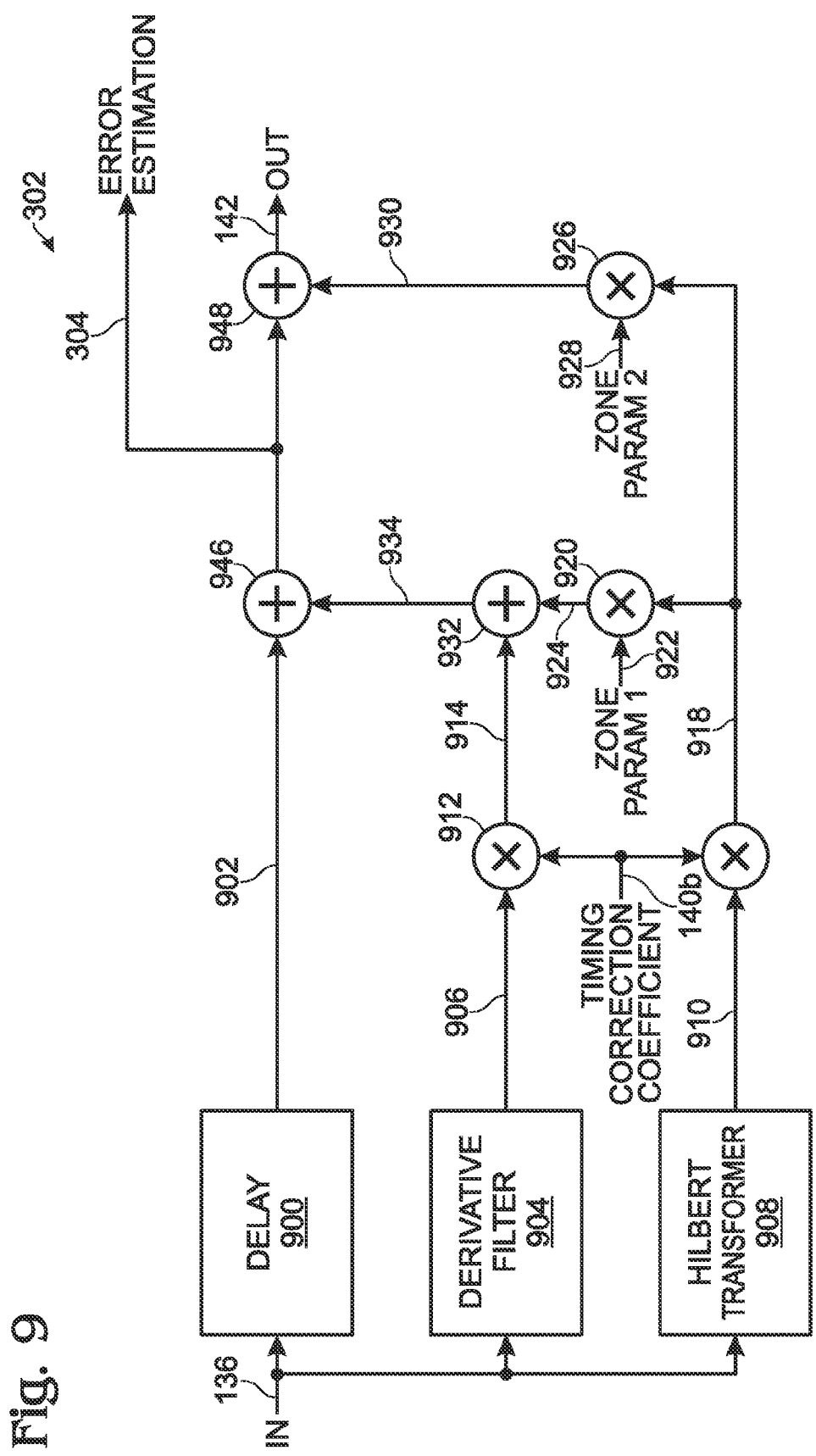
FIG. 9 is a schematic block diagram depicting an exemplary timing error correction module.

FIG. 9 is a schematic block diagram depicting an exemplary timing error correction module. The timing error correction module 302 comprises a delay 900 having an input on line 136 to accept the interleaved signal and an output on line 902 to supply a delayed signal. A derivative module 904 has an input on line 136 to accept the interleaved. signal and an output on line 906 to supply a first result. A Hilbert transformation module 908 has an input on line 136 to accept the interleaved signal and an output on line 910 to supply a second result. The delay of module 900 matches the delay through the derivative module 904 and Hilbert transformation module 908, so that when the signals "meet" again, they are aligned in time.

A seventh multiplier 912 has an input on line 906 to accept the first result, an input on line 140b to accept timing correction coefficients, and an output on line 914 to supply a third result. The timing correction coefficient 140b is a sequence of n, or one for each ADC, that follows the order in which the ADCs are used. In other words, the correction coefficient is associated with ADC channel currently being sampled.

An eighth multiplier 916 has an input on line 910 to accept the second result, an input on line 140b to accept the timing correction coefficients, and an output on line 918 to supply a fourth result. A ninth multiplier 920 has an input on line 918 to accept the fourth result, an input on line 922 to accept Nyquist zone one parameters, and an output to supply a fifth result on line 924. A tenth multiplier 926 has an input on line 918 to accept the fourth result, an input on line 928 to accept Nyquist zone two parameters, and an output on line 930 to supply a sixth result.

Two separate zone parameters may be used if the pilot tone (s2) and the input signal (s1) are in different Nyquist zones. If they are in the same zone, parameter 2 is set to zero. Generally, parameter 1 defines the zone in which the pilot tone is located, and the sum of parameters 1 and 2 is the zone in which the signal is located. The zone parameter values are 0 1 −1 2 −2 . . . for zones 1 2 3 4 5 . . . .

A third summing circuit 932 has an input on line 914 to accept the third result, an input on line 924 to accept the fifth result, and an output on line 934 to supply a seventh result. A fourth summing circuit 946 has an input on line 934 to accept the seventh result, an input on line 902 to accept the delayed signal, and an output on line 304 to supply the error estimation signal. A fifth summing circuit 948 has an input to accept the error estimation signal on line 304, an input to accept the sixth result on line 930, and an output to supply an timing corrected digital output on line 142.

Note: the various components described above in FIGS. 1 through 9 have been described as modules, components, systems, devices, and the like, and may be intended to refer to hardware, firmware, a combination of hardware and software, software enabled as a sequence of microprocessor instructions stored in a non-transitory or computer-readable medium, or software in execution.

As noted above, a DFT function can be used to detect the tone. Since the frequency of the test tone is exactly known, the value of a single DFT bin can be used to detect its phase and amplitude, in the presence of noise and other unwanted signals this provides much a more accurate method than the high pass filter. This method allows for the detection of a tone of any frequency with just one parameter change (the bin of interest), which can be easily made programmable.

The DFT can be implemented in several ways, for instance, using the FFT algorithm. However, since there is only one frequency bin of interest, a much more hardware efficient implementation is obtained using a single bin DFT algorithm, such as the Goertzel algorithm. As noted in Wikipedia, the Goertzel algorithm is a digital signal processing (DSP) technique that provides a means for efficient evaluation of individual terms of a DFT. Like the DFT, the Goertzel algorithm analyses one selectable frequency component from a discrete signal. Unlike direct DFT calculations, the Goertzel algorithm applies a single real-valued coefficient at each iteration, using real-valued arithmetic for real-valued input sequences. For covering a full spectrum, the Goertzel algorithm has a higher order of complexity than FFT algorithms. But for computing a small number of selected frequency components, it is more numerically efficient. The simple structure of the Goertzel algorithm makes it well suited to small processors and embedded applications, though not limited to these. The Goertzel algorithm can also be used "in reverse" as a sinusoid synthesis function, which requires only 1 multiplication and 1 subtraction per generated sample.

For the DFT based detection to work well in a presence of a wide band input signal, the signal going to the DFT can to be shaped with a window function to prevent excessive spectral leakage from the wide band signal to the image tone frequency. This is accomplished by multiplying it by an m-point window function (the Kaiser window and Blackman window are two examples). For an m samples long sequence of signal values, each signal sample is multiplied by the corresponding window function value. For the next m values the same process is repeated, and so on. The window function values can be generated, for instance, by using a lookup table.

Alternatively stated, the DFT is performed on a finite (i.e. m samples) length sequence of signal samples. This process can be viewed as applying (multiplying each input sample by the corresponding window sample) a rectangular window to an infinitely long input sequence. The rectangular window has value 1 from point 0 to point m−1 and value zero elsewhere. So even when the signal is not explicitly windowed, it is in fact windowed with a rectangular window. Multiplication in the time domain is equivalent to convolution in the frequency domain, and as a result, the frequency response of the window function distorts the output of the DFT (as compared to a Fourier transform for an infinitely long signal in continuous time domain). But, by selecting a proper window function, a trade-off can be made between resolution and dynamic range. A rectangular window gives good resolution but poor dynamic range, which means that detecting small signals in the presence of strong signals in other nearby frequencies is difficult. Other window functions such as the Kaiser window, give much wider dynamic range, at the cost of worse frequency resolution.

When the gain error and timing skew are both simultaneously present in the ADC output, the complex valued DFT amplitude is used to maintain orthogonality, which is required to distinguish between these two errors. If only one type of error is present, the power of the DFT bin can be used instead. As shown in FIG. 8, two DFTs are performed: one for the frequency bin (814) where the test tone is located and another one (810) for the bin into which the image tone falls. The DFT gives a new output value every m samples. This complex value represents the phase and amplitude of the tone at the desired frequency bin.

To obtain the signals representing the gain error and timing error, the image tone is compared to the test tone by using scalar projection (a vector operation). The vector component that is in phase with the test tone represents the gain error and the component 90 degrees out of phase is the timing error. These two components are obtained using the imaginary and real parts of the DFT outputs.

Figure 10:
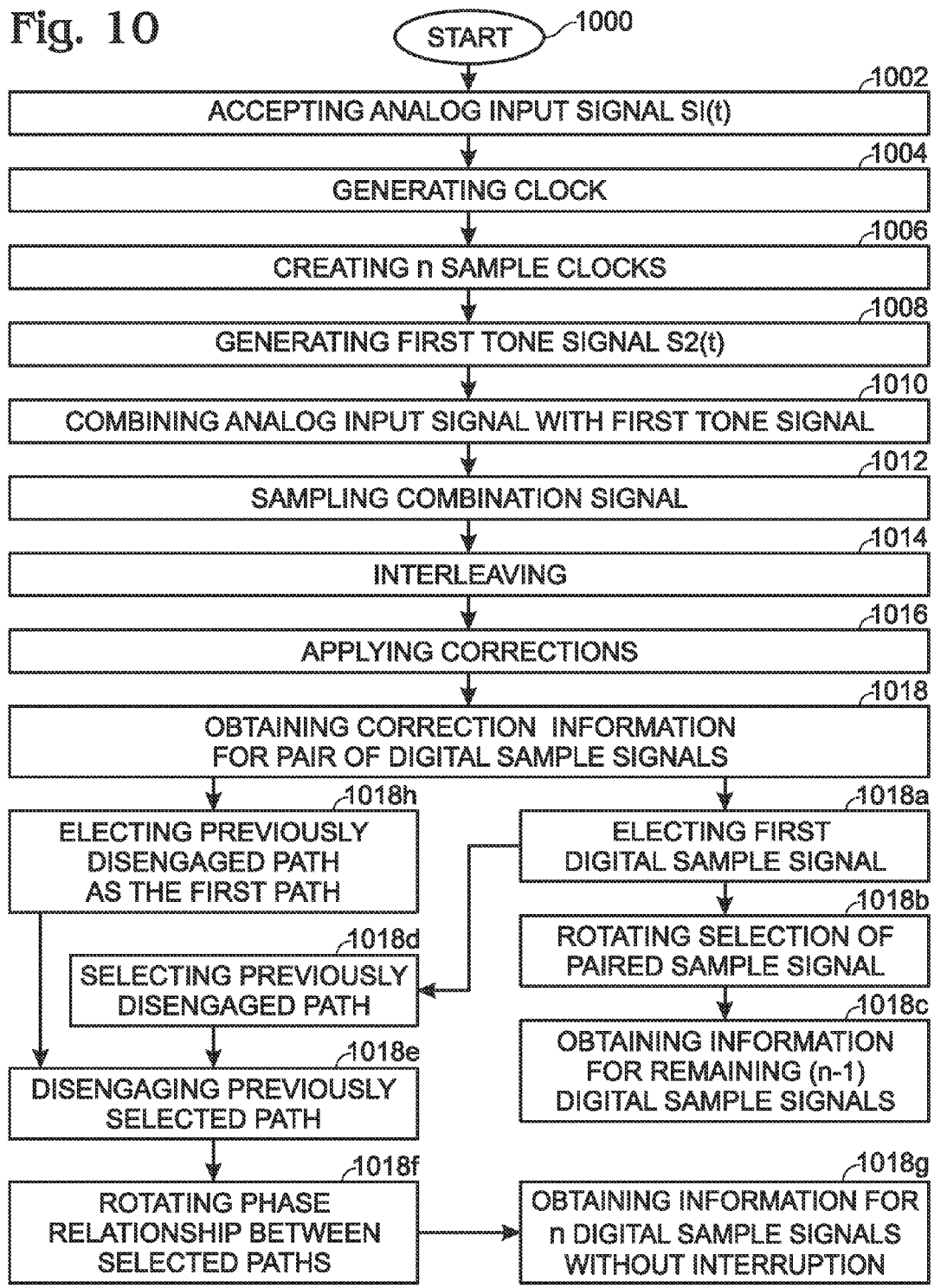
FIG. 10 is a flowchart illustrating a method of performing background corrections for an n-path interleaving ADC.

FIG. 10 is a flowchart illustrating a method of performing background corrections for an n-path interleaving ADC. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps, and the details of the method are supported by the explanations of FIGS. 1 through 9. The method starts at Step 1000.

Step 1002 accepts an analog input signal $s1(t)$ having a first frequency f1 and a bandwidth (BW). Step 1004 generates a clock having a clock frequency fs. In one aspect, the second frequency is between $m(fs/2)$ and a lower limit of BW in an (m+1)th Nyquist zone, or between an upper limit of BW in the (m+1)th Nyquist zone and $(m+1)fs/2$, where m is an integer greater than or equal to zero. Step 1006 creates n sample clocks with evenly spaced phases, each having a sample clock frequency of fs/n. Step 1008 generates a first tone signal $s2(t)$ having a predetermined second frequency f2 outside BW. Step 1010 combines the analog input signal and the first tone signal, creating a combination signal. Step 1012 samples the combination signal using the sample clocks, creating n digital sample signals per clock period 1/fs. Step 1014 interleaves the n digital sample signals, creating an interleaved signal. Step 1016 applies corrections that minimize errors in the interleaved signal to obtain a corrected digital output. For example, Step 1116 may adjust digital sample signal amplitudes, adjust sample clock phases, adjust the digital sample signal phases, or combinations or the above-mentioned. adjustments. For a pair of digital sample signals, Step 1018 determines errors at an alias frequency f3, associated with the second frequency f2, to obtain correction information. In one variation, Step 1016 applies equal and opposite corrections to the first digital sample signal and the paired digital sample signal.

In one aspect, determining errors at the alias frequency f3 includes substeps. Step 1018a elects a first digital sample signal, from among the n digital sample signals, as a constant. In some variations the election of the first digital sample signal is relatively constant, compared to the rate at which the other digital sample signals are paired with the first digital sample signal. That is, Step 1018a may periodically reelect a new first digital sample signal from among the n digital sample signals, different than a preceding first digital sample signal election.

Step 1018b rotates the selection of the digital sample signal paired with the first digital sample signal from among the remaining (n−1) digital sample signals. Typically, a 180 degree phase difference is maintained between the sample clock supplied to the first path and the sample clock supplied to the path associated with the digital sample signal paired with the first digital sample signal. Step 1018c sequentially obtains correction information for the remaining (n−1) digital sample signals.

In one aspect, sampling the combination signal using the n sample clocks in Step 1012 includes sampling the combination signal via n paths using n corresponding sample clock phases. Then, electing the first digital sample signal as a constant in Step 1018a includes supplying a constant sample clock phase to a first path associated with the first digital sample signal. Rotating the selection of the digital sample signal paired with the first digital sample signal in Step 1018b includes rotating the sample clock phases supplied to the remaining (n−1) paths. In one variation, sampling the combination signal using the n sample clocks in Step 1012 includes interpolating current digital sample signals during a sample clock phase rotation reset.

In another variation where Step 1012 samples the combination signal via n paths using n corresponding clock phases. Step 1006 creates n sample clocks by providing a common master clock signal and a divider assigned to each corresponding path, with each divider having a selectable starting clock phase. Then, rotating the selection of the digital sample signal paired with the first digital sample signal in Step 1018b includes rotating the order in which the divider starting clock phases are selected.

In one other aspect, Step 1018 sequentially obtains correction information for the remaining (n−1) digital sample signals by calculating the mean error of the (n) digital sample signals. Then, Step 1016 applies corrections that minimize errors in the interleaved signal by minimizing the mean error, see FIG. 11.

In another aspect, Step 1010 creates a combination signal that is supplied to (n+1) potential paths. Then, determining errors at the alias frequency f3 includes some alternative substeps. As above, Step 1018a elects a first path from among the (n+1) paths, as a constant first digital sample signal. During a sample clock phase rotation reset, Step 1018d selects a previously disengaged path. Step 1018e disengages a previously selected path. Step 1018f rotates the phase relationship between the selected (n−1) paths, and Step 1018g sequentially obtains correction information for n digital sample signals without interruption due to sample clock phase rotation resets.

In a variation to this method, Step 1018h elects as the first path, a previously disengaged path during a sample clock phase rotation reset. Step 1018e disengages a previously selected path. Step 1018f rotates the phase relationship between the (n−1) selected paths, and Step 1018g sequentially obtains correction information for n digital sample signals without interruption due to sample clock phase rotation resets.

Figure 11:
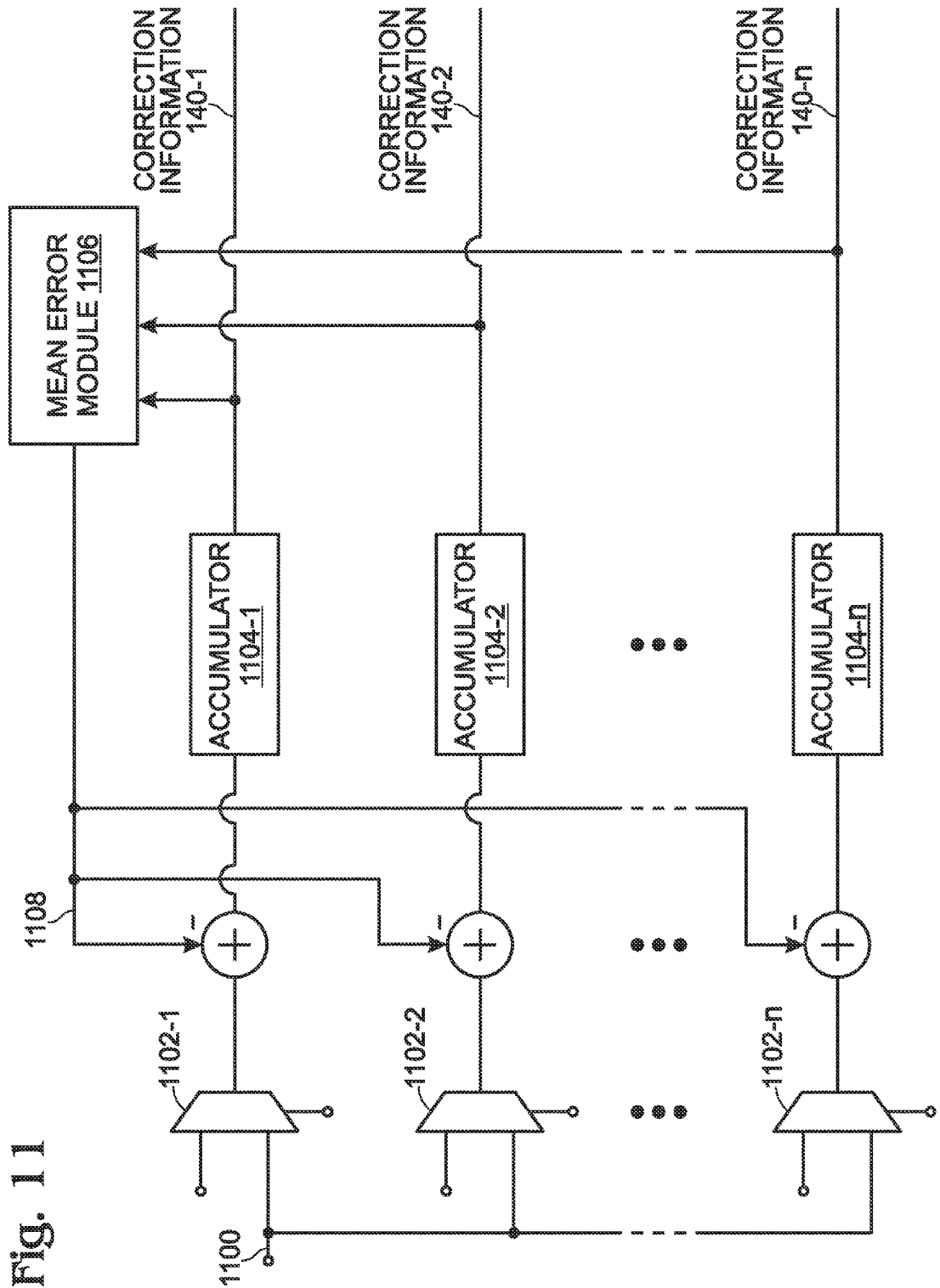
FIG. 11 is a schematic block diagram depicting system for applying gain and timing correction information in a manner that minimizes the mean error.

FIG. 11 is a schematic block diagram depicting a system for applying gain and timing correction information in a manner that minimizes the mean error. Within the error estimation module, product information derived from a comparison of the test and image tones is supplied on line 1100. Although only one system is shown it should be understood that there may be separate systems for the collection of mean timing and mean gain correction information. Multiplexers 1102-1 through 1102-n are selectively engaged, depending on which ADC paths are being paired. Correction information is collected in accumulators 1104-1 through 1104-n. The accumulated correction information on lines 140-1 through 140-n is fed to mean module 1106. This information is used to calculate a mean error on line 1108, which is subtracted from the correction information being accumulated.

A system and method have been provided for performing background corrections in an n-path interleaving analog-to-digital converter ADC. Examples of particular message structures, processes, and modules have been presented to illustrate the invention. However, the invention is not limited to merely these examples. Other variations and embodiments of the invention will occur to those skilled in the art.

I claim:

1. A method of performing background corrections for an n-path interleaving analog-to-digital converter (ADC), the method comprising:
accepting an analog input signal $s1(t)$ having a first frequency f1 and a bandwidth (BW);
generating a clock having a clock frequency fs;
creating n sample clocks with evenly spaced phases, each having a sample clock frequency of fs/n, where n is an integer greater than 2;
generating a first tone signal $s2(t)$ having a predetermined second frequency f2 outside BW;
combining the analog input signal and the first tone signal, creating a combination signal;
sampling the combination signal using the n sample clocks, creating n digital sample signals per clock period 1/fs;
interleaving the n digital sample signals, creating an interleaved signal;
applying corrections that minimize errors in the interleaved signal to obtain a corrected digital output; and,
for a pair of digital sample signals, determining errors at an alias frequency f3, associated with the second frequency f2, to obtain correction information.

2. The method of claim 1 wherein determining errors at the alias frequency f3 includes:
electing a first digital sample signal, from among the n digital sample signals, as a constant;
rotating the selection of the digital sample signal paired with the first digital sample signal from among the remaining (n−1) digital sample signals; and,
sequentially obtaining correction information for the remaining (n−1) digital sample signals.

3. The method of claim 2 wherein sampling the combination signal using the n sample clocks includes sampling the combination signal via n paths using n corresponding sample clock phases;
wherein electing a first digital sample signal as a constant includes supplying a constant sample clock phase to a first path associated with the first digital sample signal; and,
wherein rotating the selection of the digital sample signal paired with the first digital sample signal includes rotating the sample clock phases supplied to the remaining (n−1) paths.

4. The method of claim 2 wherein rotating the sample clock phases supplied to the remaining (n−1) paths includes maintaining a 180 degree phase difference between the sample clock supplied to the first path and the sample clock supplied to the path associated with the digital sample signal paired with the first digital sample signal.

5. The method of claim 2 wherein sampling the combination signal using the n sample clocks includes interpolating current digital sample signals during a sample clock phase rotation reset.

6. The method of claim 2 wherein sampling the combination signal using the n sample clocks includes sampling the combination signal via n paths using n corresponding clock phases;
wherein creating n sample clocks with evenly spaced phases includes providing a common master clock signal and a divider assigned to each corresponding path, each divider having a selectable starting clock phase; and,
wherein rotating the selection of the digital sample signal paired with the first digital sample signal includes rotating the order in which the divider starting clock phases are selected.

7. The method of claim 2 wherein electing the first digital sample signal, from among the n digital sample signals, as a constant includes periodically reelecting a new first digital sample signal from among the n digital sample signals, different than a preceding first digital sample signal election.

8. The method of claim 2 wherein applying corrections that minimize errors in the interleaved signal includes applying equal and opposite corrections to the first digital sample signal and the paired digital sample signal.

9. The method of claim 1 wherein creating the combination signal includes providing the combination signal to (n+1) potential paths;
wherein determining errors at the alias frequency f3 includes:
electing a first path from among the (n+1) paths, as a constant first digital sample signal;
during a sample clock phase rotation reset, selecting a previously disengaged path;
disengaging a previously selected path;
rotating the phase relationship between the selected (n−1) paths; and,
sequentially obtaining correction information for n digital sample signals without interruption due to sample clock phase rotation resets.

10. The method of claim 1 wherein creating the combination signal includes providing the combination signal to (n+1) potential paths;
wherein determining errors at the alias frequency f3 includes:
during a sample clock phase rotation reset, electing as the first path, a previously disengaged path;
disengaging a previously selected path;
rotating the phase relationship between the (n−1) selected paths; and,
sequentially obtaining correction information for n digital sample signals without interruption due to sample clock phase rotation resets.

11. The method of claim 2 wherein sequentially obtaining correction information for the remaining (n−1) digital sample signals includes calculating the mean error of the (n) digital sample signals; and,
wherein applying corrections that minimize errors in the interleaved signal includes applying correction to minimize the mean error.

12. A system performing background corrections for an n-path interleaving analog-to-digital converter (ADC), the system comprising:
a first summing circuit having an input to accept an analog input signal $s1(t)$ with a first frequency f1 and a bandwidth (BW), an input to accept a first tone signal $s2(t)$ having a predetermined second frequency f2 outside BW, and an output to supply a combination signal;

a clock having a clock frequency fs, with outputs to supply n sample clocks with evenly spaced phases, each having a sample clock frequency of fs/n, where n is an integer greater than 2;

an interleaving ADC having inputs to accept the combination signal and the n sample clocks, the interleaving ADC creating n digital sample signals in response to sampling the combination signal with the n sample clocks, and supplying an interleaved signal at an output;

an error correction module having an input to accept the interleaved signal and an input to accept correction information, the error correction module applying corrections that minimize errors in the interleaved signal, and supplying a corrected digital output; and, an error estimation module having an input to accept the corrected digital output, the error estimation module determining errors at an alias frequency f3, associated with the second frequency f2, for a pair of digital sample signals, and supplying correction information at an output for a first digital sample signal.

13. The system of claim 12 wherein the error estimation module elects a first digital sample signal, from among the n digital sample signals, as a constant, and sequentially obtains correction information for the remaining (n−1) digital sample signals by rotating the selection of the digital sample signal paired with the first digital sample signal from among the remaining (n−1) digital sample signals.

14. The system of claim 13 wherein the clock has an input to accept phase control signals for controlling the supply of the n sample clocks;
    wherein the interleaving ADC comprises n paths, each path including an ADC having an analog input to accept the combination signal and a clock input connected to a corresponding clock output; and,
    wherein the error estimation module has an output to supply the phase control signal for electing a constant clock phase to be supplied to an ADC first path associated with the first digital sample signal, and for rotating the sample clock phases supplied to the remaining ADC (n−1) paths.

15. The system of claim 13 wherein the clock maintains a 180 degree phase difference between the sample clock supplied to the ADC first path and the sample clock supplied to the ADC path associated with the digital sample signal paired with the first digital sample signal.

16. The system of claim 13 wherein the error correction module interpolates current digital sample signals during a sample clock phase rotation reset.

17. The system of claim 13 wherein the interleaving ADC comprises n paths, each path including an ADC having an analog input to accept the combination signal and a clock input connected to a corresponding clock output; and,
    wherein the clock comprises:
        n dividers, each divider having an input to accept a common master clock signal, an input to accept a phase control signal, an input to accept a reset signal, and an output to supply a selectable starting clock phase to a corresponding ADC path in response to the phase control signal; and,
    wherein the error estimation module has an output to supply the phase control signals for rotating the selection of the starting clock phases supplied by the dividers, and an output to supply the reset signals for initiating a sample clock phase rotation reset.

18. The system of claim 13 wherein the error estimation module periodically reelects a new first digital sample signal from among the n digital sample signals, different than a preceding first digital sample signal election.

19. The system of claim 13 wherein the error estimation module applies equal and opposite corrections to the first digital sample signal and the paired digital sample signal.

20. The system of claim 12 wherein the clock has an input to accept phase control signals, an output to supply a constant first clock phase to an ADC first path associated with the first digital sample signal, and n selectively engagable outputs for controlling the supply of the (n−1) sample clocks;
    wherein the interleaving ADC comprises (n−1) paths, each path including an ADC having an analog input to accept the combination signal and a clock input connected to a corresponding clock output; and,
    wherein the error estimation module has an output to supply the phase control signals to the clock for disengaging a previously selected ADC path, selecting a previously disengaged ADC path, and rotating the phase relationship between the selected ADC paths to obtain correction information for n digital sample signals without interruption due to clock phase rotation resets.

21. The system of claim 12 wherein the clock has an input to accept phase control signals, and (n+1) selectively engagable outputs for controlling the supply of the n sample clocks;
    wherein the interleaving ADC comprises (n+1) paths, each path including an ADC having an analog input to accept the combination signal and a clock input connected to a corresponding clock output; and,
    wherein the error estimation module has an output to supply the phase control signals to the clock for disengaging a previously selected ADC path, electing a previously disengaged ADC path as a first path associated with the first digital sample signal, and rotating the phase relationship between the selected ADC paths to obtain correction information for n digital sample signals without interruption due to clock phase rotation resets.

22. The system of claim 13 wherein the error estimation module calculates the mean error of the (n) digital sample signals, and supplies correction information to minimize the mean error.

* * * * *